(12) United States Patent
Fletcher et al.

(10) Patent No.: US 6,320,441 B1
(45) Date of Patent: Nov. 20, 2001

(54) I/O TRANCEIVER HAVING A PULSED LATCH RECEIVER CIRCUIT

(75) Inventors: Tom D. Fletcher; Sam E. Calvin; Tim Frodsham, all of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1318 days.

(21) Appl. No.: 08/665,760

(22) Filed: Jun. 19, 1996

Related U.S. Application Data

(62) Division of application No. 08/151,527, filed on Nov. 12, 1993, now Pat. No. 5,721,875.

(51) Int. Cl.[7] .................................................. H03K 3/356
(52) U.S. Cl. ........................... 327/211; 327/212; 327/225
(58) Field of Search .................................. 327/52, 56, 57, 327/94, 89, 210, 211, 212, 214, 225; 326/56, 57, 58, 93, 95

(56) References Cited

U.S. PATENT DOCUMENTS

| | | | |
|---|---|---|---|
| 5,107,462 | * 4/1992 | Grundmann et al. | 365/189.02 |
| 5,130,580 | * 7/1992 | Min et al. | 327/53 |
| 5,172,011 | * 12/1992 | Leuthold et al. | 327/292 |
| 5,196,742 | * 3/1993 | McDonald | 327/68 |
| 5,347,175 | * 9/1994 | Laug et al. | 327/77 |
| 5,563,533 | * 10/1996 | Cave et al. | 327/57 |

OTHER PUBLICATIONS

"Sun, Xerox to License SCBus Technology", *Microprocessor Report*, Linley Gwennap, pp. 1,6 & 8, Mar. 8, 1993.

* cited by examiner

*Primary Examiner*—Kenneth B. Wells
(74) *Attorney, Agent, or Firm*—Blakely, Sokoloff, Taylor & Zafman LLP

(57) ABSTRACT

A GTL I/O transceiver circuit having a pulsed latch receiver. A pulse generator generate a first pulse and a second pulse within the first pulse in response to a rising edge of the bus clock. The first pulse turns on the differential amplifier of the receiver circuit just long enough to provide a valid amplifier output signal. The second pulse controls a tristate latch such that the value of the amplifier output signal is latched before the differential amplifier is turned off. The pulsed latch receiver turns the differential amplifier on for only a fraction of the period of the bus clock such that power dissipation of the pulsed latch receiver circuit is significantly reduced. By using the pulsed latch receiver in VLSI components having hundreds of I/Os, significant reduction in overall component power dissipation can be achieved and static DC power is eliminated. The GTL I/O transceiver is useful for interfacing VLSI CMOS components to a terminated bus.

3 Claims, 5 Drawing Sheets

# I/O TRANCEIVER HAVING A PULSED LATCH RECEIVER CIRCUIT

This is a divisional of application Ser. No. 08/151,527, filed Nov. 12, 1993, now U.S. Pat. No. 5,721,875.

BACKGROUND OF THE INVENTION

1. Field of the Invention

The present invention relates generally to I/O (input/output) transceiver circuits and more specifically to GTL (Gunning Transceiver Logic) I/O transceivers having a pulsed latch receiver circuit.

2. Art Background

High performance VLSI processors having several hundred I/O lines and associated transceiver circuits are common. Wide (e.g. 64 bit), high-speed I/O busses are used to interconnect VLSI components. The VLSI components use I/O transceiver circuits to drive information on and receive information from the I/O bus. Various I/O transceiver circuits are known. Examples are CMOS (Complementary Metal-Oxide Semiconductor), ECL (Emitter Coupled Logic), BTL (Backplane Transceiver Logic), and standard GTL (Gunning Transceiver Logic) transceiver circuits. Power dissipation, signal quality, noise immunity, and performance are important factors to consider when designing a transceiver circuit and I/O bus.

Conventional CMOS transceivers coupled with unterminated I/O signal busses suffer from excessive noise and ringing at the low to high transition and, therefore, do not have suitable speed performance to meet the demands of today's high-speed busses. Terminated CMOS transceivers have good speed performance, but dissipate about five times more power than standard GTL transceivers. Traditional ECL designs using terminated transmission line interconnect techniques provide high speed, but dissipate excessive power. Standard GTL transceivers use terminated signal lines and I/O signal voltage levels of approximately 0.4 V and 1.2 V to achieve high speed and a power dissipation of about 9 mW for each driver and 5.5 mW for each receiver. Standard GTL transceiver circuits are described in U.S. Pat. No. 5,023,488 issued to Gunning et al. An article related to GTL transceivers is Linley Gwennap, "Sun, Xerox to License XDBus Technology," *Microprocessor Report*, 8 March, 1993, pp. 1, 6, and 8.

The receiver circuit of the standard GTL transceiver utilizes a CMOS differential amplifier that dissipates constant DC current. This DC current is undesirable in a microprocessor for three reasons: 1) the DC current contributes to thermal heating of the microprocessor, 2) the DC current consumes battery power of mobile computers even when the microprocessor is put into a static mode to save power, and 3) the DC current is too large to allow IDDQ testing of the microprocessor. IDDQ testing comprises measuring the static DC current of the microprocessor to detect faulty devices on the microprocessor.

For a typical design, the receiver circuit consumes about 5.5 mW of power during normal operation. For this design, the receiver circuits of a VLSI chip having 200 I/0 pins would dissipate about 1.1 W of power during normal operation. As overall chip power dissipation increases, temperature controlling devices such as heat sinks, cooling fans, etc. are required to maintain proper microprocessor operation. Power dissipation of today's microprocessors is high enough that thermal considerations significantly affect overall computer system design.

Therefore, an I/O transceiver having a pulsed latch receiver circuit is needed.

SUMMARY OF THE INVENTION

The present invention is drawn to an I/O transceiver having a pulsed latch receiver circuit, a method for sampling I/O lines, and an implementation of the present invention in a computer system.

In a first embodiment, the present invention includes a receiver that receives an input signal, a reference voltage, and a clock signal, and generates a receiver output signal. The receiver includes a pulse generator and a differential amplifier. The pulse generator receives the clock signal and generates a first pulse in response to a first edge of the clock signal. The differential amplifier receives the input signal, the reference voltage, and the first pulse and compares the input signal to the reference voltage to generate an amplifier output signal. The differential amplifier compares only during the first pulse.

In an alternate embodiment, the pulse generator further generates a second pulse in response to the rising edge of the clock signal. A tristate latch receives the amplifier output signal and the second pulse and latches the value of the differential output in response to the second pulse.

In another embodiment, the receiver circuit includes a driver circuit to provide a complete I/O transceiver circuit.

In another embodiment multiple I/O transceiver circuits are utilized in the processor of a computer system to reduce the power consumption of the processor.

DETAILED DESCRIPTION OF THE INVENTION

An I/O transceiver having a pulsed latch receiver circuit, a method for sampling I/O lines, and an implementation of the pulsed latch receiver circuit in the I/O transceivers of a processor in a computer system are described. In the following description, numerous specific details are set forth in order to provide a thorough understanding of the present invention. It will be apparent, however, to one skilled in the art that the present invention may be practiced without these specific details. In other instances, well known methods and circuits are shown in block diagram form in order not to obscure the present invention unnecessarily.

It should be understood that the present invention is typically comprised of transistor circuits that are readily manufacturable using well known complementary metal-oxide semiconductor (CMOS) technology or other semiconductor manufacturing processes.

Figure 1A:
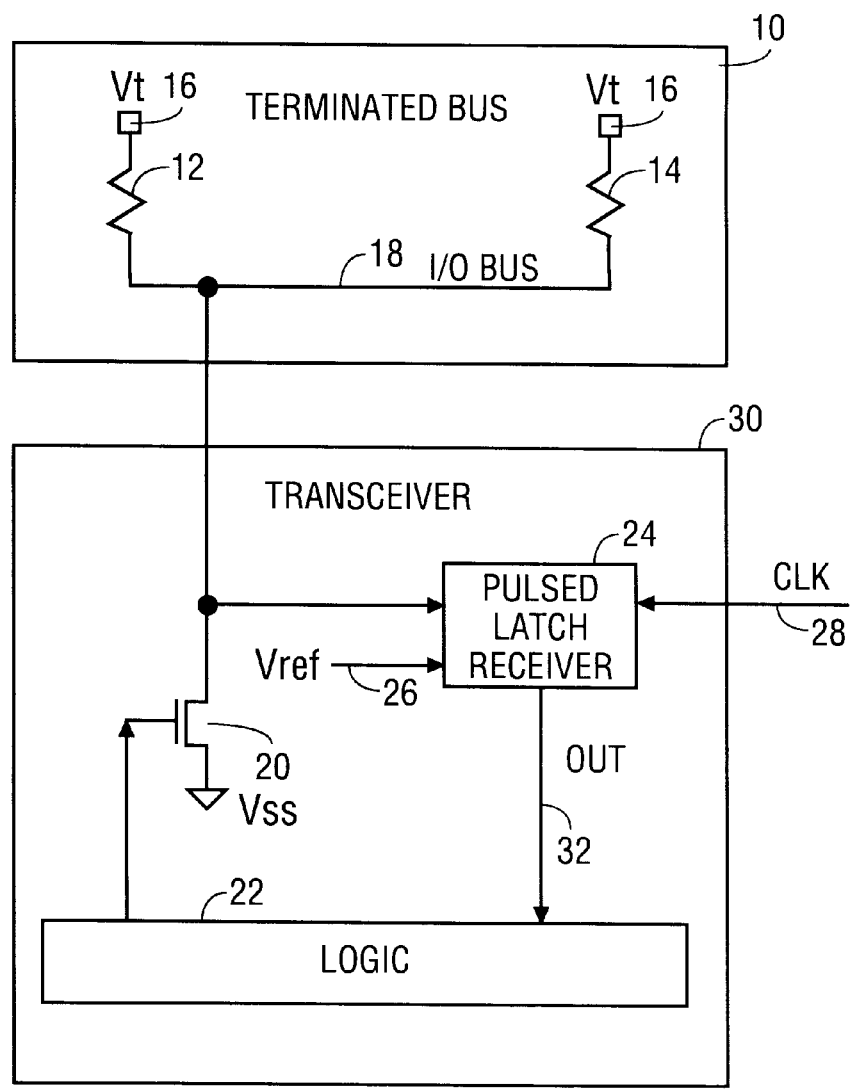
FIGS. 1A and 1B are schematic diagrams of the GTL I/O transceiver circuit of the present invention coupled to a terminated bus.
Figure 1B:
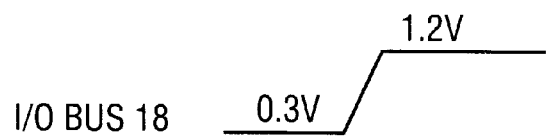

Referring now to FIGS. 1A and 1B, a schematic diagram of on embodiment of the GTL I/O transceiver circuit of the present invention coupled to a terminated bus is shown. A terminated bus 10 is coupled to a transceiver 30 via an I/O bus 18. The I/O bus 18 carries information between various components of a computer system. The I/O bus 18 is terminated on one end by a resistor 12 and on the other end by a resistor 14. Whenever there is more than one driver (or a single driver is not located at one end of the signal path) the I/O bus 18 is terminated at both ends to prevent reflections. Resistors 12 and 14 are chosen to match the loaded impedance of the signal lines (e.g., the printed circuit board traces) of the I/O bus 18 in order to reduce ringing and reflections, thereby providing a cleaner, faster transmission of information. The preferred value for resistors 12 and 14 in a CMOS design for typical printed circuit boards is 50Ω. Resistors 12 and 14 are coupled to a supply voltage, Vt voltage 16. When the transceiver 30 is not driving the I/O bus 18, it is pulled to the Vt voltage 16 through resistors 12 and 14. The preferred value for the Vt voltage 16 is about 1.2 V. Depending on the size of the system, a slightly larger or smaller Vt voltage may be used. For example, a larger system may use a Vt voltage of about 1.4 V. The Vt voltage 16 is selected to be as low as practical to reduce power dissipation while providing reliable transmission. The resistors 12 and 14 of the terminated bus 10 are preferably located on the printed circuit board rather than on a VLSI component coupled to the bus in order to reduce the power dissipation and associated thermal problems of the VLSI component.

The transceiver 30 includes a driver 20 that drives the I/O bus 18 low, a pulsed latch receiver 24 that receives information from the I/O bus 18, and a logic block 22 that controls the driver 20 and processes information received from the pulsed latch receiver 24. The driver 20 is preferably an n-channel transistor, coupled between ground Vss and the I/O bus 18, that pulls the I/O bus 18 down to a lower signal voltage that provides sufficient noise immunity while minimizing power dissipation. In the present embodiment, the driver 20 is sized to pull the I/O bus 18 down to approximately 0.3 V (spec is below 0.4 V) when conducting. The logic block 22 represents logic that controls the driver 20 and processes information received from the pulsed latch receiver 24. The pulsed latch receiver 24 receives the I/O bus 18, a reference voltage, Vref voltage 26, and a bus clock, CLK signal 28, and generates a pulsed latch receiver output signal, OUT signal 32. In response to a rising edge of the CLK signal 28, the pulsed latch receiver 24 turns on an internal differential amplifier 48 to compare the voltage of the I/O bus input 18 to the Vref voltage 26, latches the result of the differential comparison to provide the OUT signal 32, and subsequently turns off the differential amplifier 48 to prevent unnecessary power dissipation. The preferred value for the Vref voltage 26 is about 0.8 V. For different sized systems, a slightly higher or lower value, such as 0.7 V or 0.9 V may be used.

In the embodiment described herein, the pulsed latch receiver of the present invention is implemented in a GTL I/O transceiver coupled to a terminated I/O bus. In this embodiment, the GTL I/O transceiver circuit provides an interface between a CMOS logic device and an I/O line that is terminated with a higher voltage of about 1.2 V. One of ordinary skill in the art could adapt the pulsed latch receiver of the present invention to other types of transceivers, such as ECL, BTL, or CMOS.

Figure 2A:
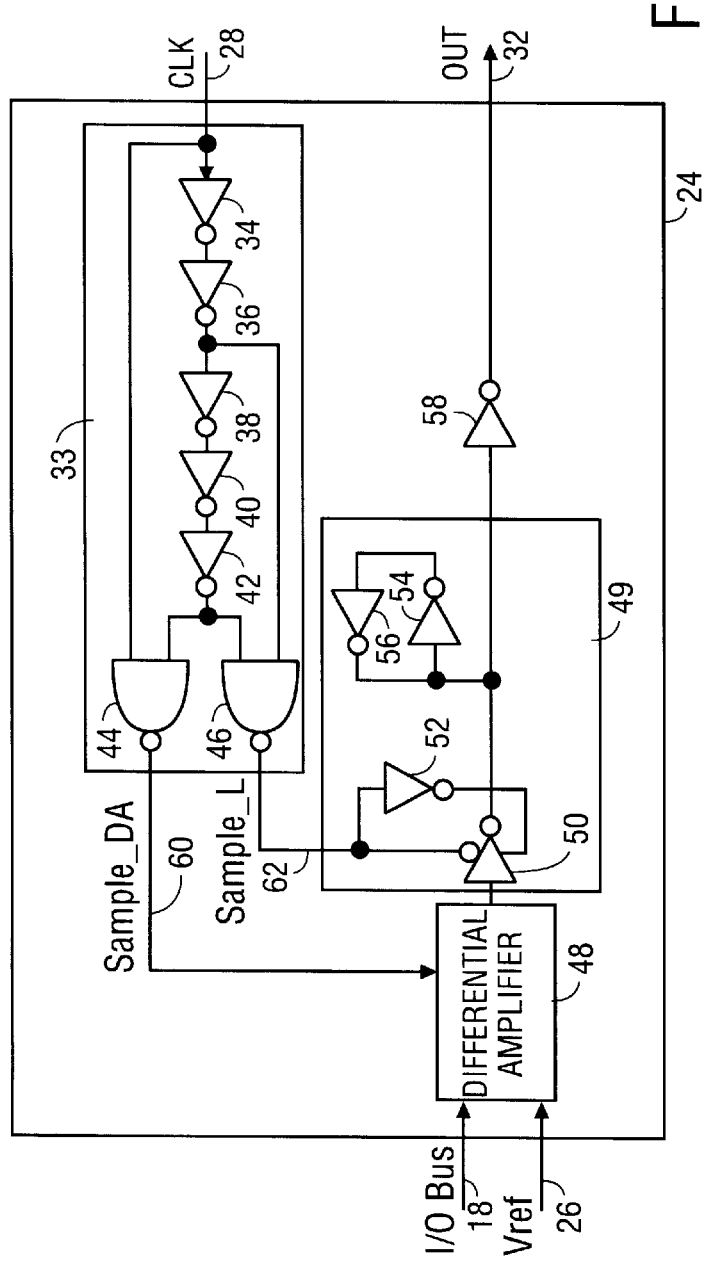
FIGS. 2A and 2B are schematic diagrams of one embodiment of the pulsed latch receiver circuit of the present invention along with waveforms illustrating the operation of the circuit.
Figure 2B:
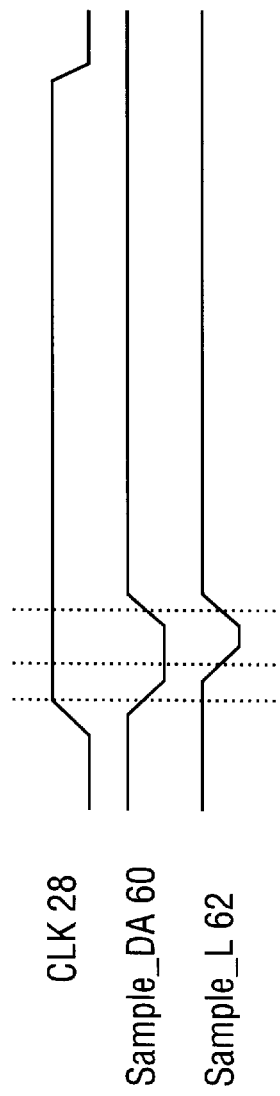

Referring now to FIGS. 2A and 2B, a schematic diagram of one embodiment of the pulsed latch receiver 24 of the present invention is shown. The pulsed latch receiver 24 includes a pulse generator 33, a differential amplifier 48, a tristate latch 49, and a buffer 58. The pulse generator 33 includes first, second, third, fourth, and fifth serially-connected inverters 34, 36, 38, 40, and 42, respectively, and first and second NAND gates 44 and 46, respectively. The first and second transistors together form a non-inverting delay element. The third, fourth, and fifth transistors together form an inverting delay element. One of ordinary skill in the art should know that different numbers of inverters, R-C circuits or other combinations can be used to produce equivalent non-inverting and inverting delay elements.

The CLK signal 28 is coupled to an input of the first NAND gate 44 and to the input of the first inverter 34. The output of the second inverter 36 is coupled to an input of the second NAND gate 46. The output of the fifth inverter 42 is coupled to an input of the first and second NAND gates 44 and 46, respectively. The first NAND gate 44 generates a first pulse on a Sample_DA signal 60 in response to a rising edged of the CLK signal 28. The second NAND gate 46 generates a second pulse on a Sample_L signal 62 in response to a rising edged of the CLK signal 28. The differential amplifier 48 receives the I/O bus 18, the Vref voltage 26, and the Sample_DA signal 60 as inputs and generates an amplifier output signal.

The tristate latch 49 includes a tristate gate 50 and latch-connected sixth and seventh inverters 54 and 56, respectively, coupled to the output of the tristate gate. The input of the sixth inverter 54 is coupled to the output of the tristate gate. The output of the sixth inverter 54 is coupled to the input of the seventh inverter 56. (The seventh inverter 56 is commonly replaced with a tristate gate.) The output of the seventh inverter 56 is coupled to the output of the tristate gate 50 and to the input of the sixth inverter 54. The tristate gate 50 receives the amplifier output signal and the Sample_L signal 62 and drives the complement of the amplifier output signal into the latch when the Sample_L signal 62 is pulsed low. The input of the buffer 58 is coupled to the output of the tristate gate 50. The output of the buffer 58 generates the OUT signal 32 which is processed by the logic block 22.

The operation of the pulsed latch receiver 24 is illustrated by the waveforms of FIGS. 2A and 2B. A rising edge of the CLK signal 28 causes the first NAND gate 44 to drive the Sample_DA signal 60 low. The Sample_DA signal 60 transitioning low turns on the differential amplifier 48 to compare the voltage of the I/O bus signal 18 to the Vref voltage 26 and generate the amplifier output signal. Two inverter delays later, the output of the second inverter 36 transitioning high causes the second NAND gate 46 to drive the Sample_L signal 62 low. The Sample_L signal 62 transitioning low causes the tristate gate 50 to d rive the complement of the amplifier output signal into the latch. Three inverter delays later the output of the fifth inverter 42 transitioning low causes the NAND gates 44 and 46 to drive the Sample_DA 60 an d the Sample_L 62 signals, respectively, high, thereby turning off the differential amplifier 48 and disabling the tristate gate 50. The buffer 58 drives the complement of the latched value (i.e. the value of the differential comparison) on the OUT signal 32 for use by the logic 22.

The width of the pulse g generated on the Sample_DA signal 60 is much shorter than the period of the CLK signal 28. For example, in one embodiment the period of the CLK signal is about 13.3 ns (the CLK signal frequency is 75 MHz) and the Sample_DA signal 60 pulse width is about 2 ns. In this embodiment, a pulsed latch receiver provides approximately 85% power savings as compared to a standard GTL receiver circuits having the same size devices. (Power savings is calculated as follows: 2/13.3=0.15, meaning that the differential amplifier is on only 15% of the time.) Note that for a lower frequency bus clock the power saving is even greater. In addition, since the pulsed latch receiver consumes much less power, the transistors of the differential amplifier 48 can be made larger to increase speed while still maintaining low power dissipation, thereby providing more flexibility in the design tradeoff between high speed and low power dissipation. For example, in another embodiment the period of the CLK signal is about 13.3 ns, the Sample_DA signal 60 pulse width is about 2 ns, but the transistors of the differential amplifier have been increased in size to provide about twice the speed performance. In this embodiment, the pulsed receiver circuit dissipates about 50% less power than a standard GTL receiver having half the speed performance.

In the embodiment of FIGS. 2A and 2B, the pulses on the Sample_DA 60 and Sample_L 62 signals end simultaneously. The pulse on the Sample_L signal 62 should end either simultaneously with or before the pulse on the Sample_DA signal 62 to insure that a valid differential output value is latched by the tristate latch 49 before the differential amplifier 48 is turned off. Furthermore, the Sample_DA signal 60 should be pulsed low before the Sample_L signal 62 to allow the differential amplifier to power up and provide a stable differential output value before the tristate latch 49 is enabled to latch the value. In other words, the pulse that enables tristate latch should occur within the pulse that turns on the differential amplifier.

Figure 3:
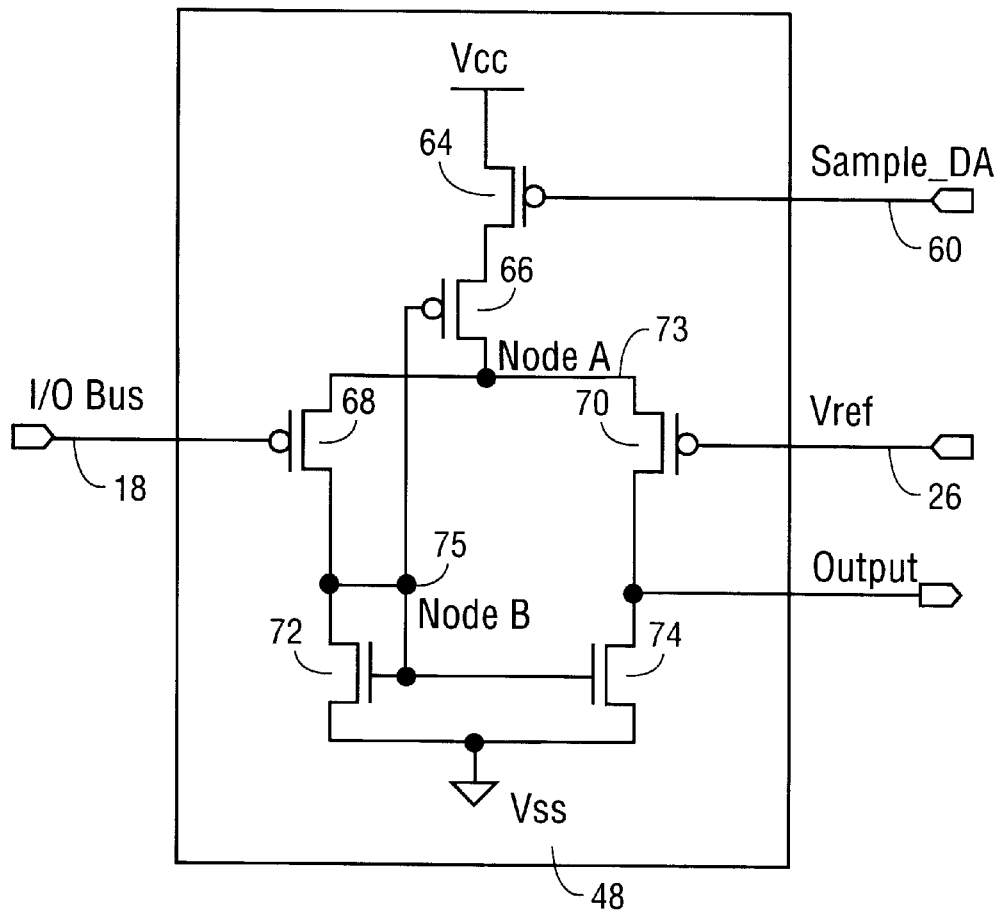
FIG. 3 is a schematic diagram of the differential amplifier used in one embodiment of the pulsed latch receiver circuit of the present invention.

Referring now to FIG. 3, a schematic diagram of an embodiment of the differential amplifier 48 is shown. The differential amplifier 48 includes first, second, third, and fourth p-type transistors 64, 66, 68, and 70, respectively and fifth and sixth n-type transistors 72 and 74, respectively. The source of the first transistor 64 is coupled to a power supply voltage Vcc; the gate of the first transistor 64 is coupled to the Sample_DA signal 60; and the drain of the first transistor 64 is coupled to the source of the second transistor 66. The gate of the second transistor 66 is coupled to a node B 75; and the drain of the second transistor 66 is coupled to a node A 73. The source of the third transistor 68 is coupled to the node A 73; the gate of the third transistor 68 is coupled to the I/O bus 18; and the drain of the third transistor 68 is coupled to the node B 75. The source of the fourth transistor 70 is coupled to the node A 73; the gate of the fourth transistor 70 is coupled to the Vref voltage 26; and the drain of the fourth transistor 70 is coupled to the amplifier output signal. The source of the fifth transistor 72 is coupled to ground Vss; and the gate and drain of the fifth transistor 72 are coupled to the node B 75. The source of the sixth transistor 74 is coupled to ground Vss; the gate of the sixth transistor 74 is coupled to the node B 75; and the drain of the sixth transistor 74 is coupled to the amplifier output signal.

The first transistor 64 acts as an on/off switch to turn the differential amplifier 48 on and off in response to pulses on the Sample_DA signal 60 generated by the pulse generator 33. The second transistor 66 is the current source for the differential amplifier 48. Connecting the gate of the second transistor 66 to the node B 75 provides a feedback that makes the differential amplifier 48 performance more constant over Vcc power supply variations. The connection also reduces the input capacitance (as compared to the standard GTL differential amplifier design) to make the differential amplifier 48 faster.

In one embodiment the pulsed latch receiver circuit of the present invention is implemented in a GTL transceiver. The Vref voltage 26 is about 0.8 V and the low and high voltage levels of the I/O bus 18 are about 0.3 V and 1.2 V, respectively. This embodiment interfaces a VLSI CMOS logic device to the I/O bus 18. When the Sample_DA signal 60 enables the differential amplifier, the differential amplifier operates such that if the value of the I/O bus 18 is higher or lower than the Vref voltage 26, then the amplifier output signal is pulled high or low, respectively.

In its overall operation the pulsed latch receiver of the present invention provides a method for sampling I/O lines to reduce the power consumption of the pulsed latch receiver circuit. A first pulse is used to temporarily turn on the differential amplifier of the pulsed latch receiver long enough to determine the value (high or low) of the I/O line and then turn the differential amplifier off to prevent unnecessary power dissipation. A second pulse that occurs within the first pulse is used to latch the output of the differential amplifier output, thereby preserving the differential comparison information after the differential amplifier is turned off.

Figure 4:
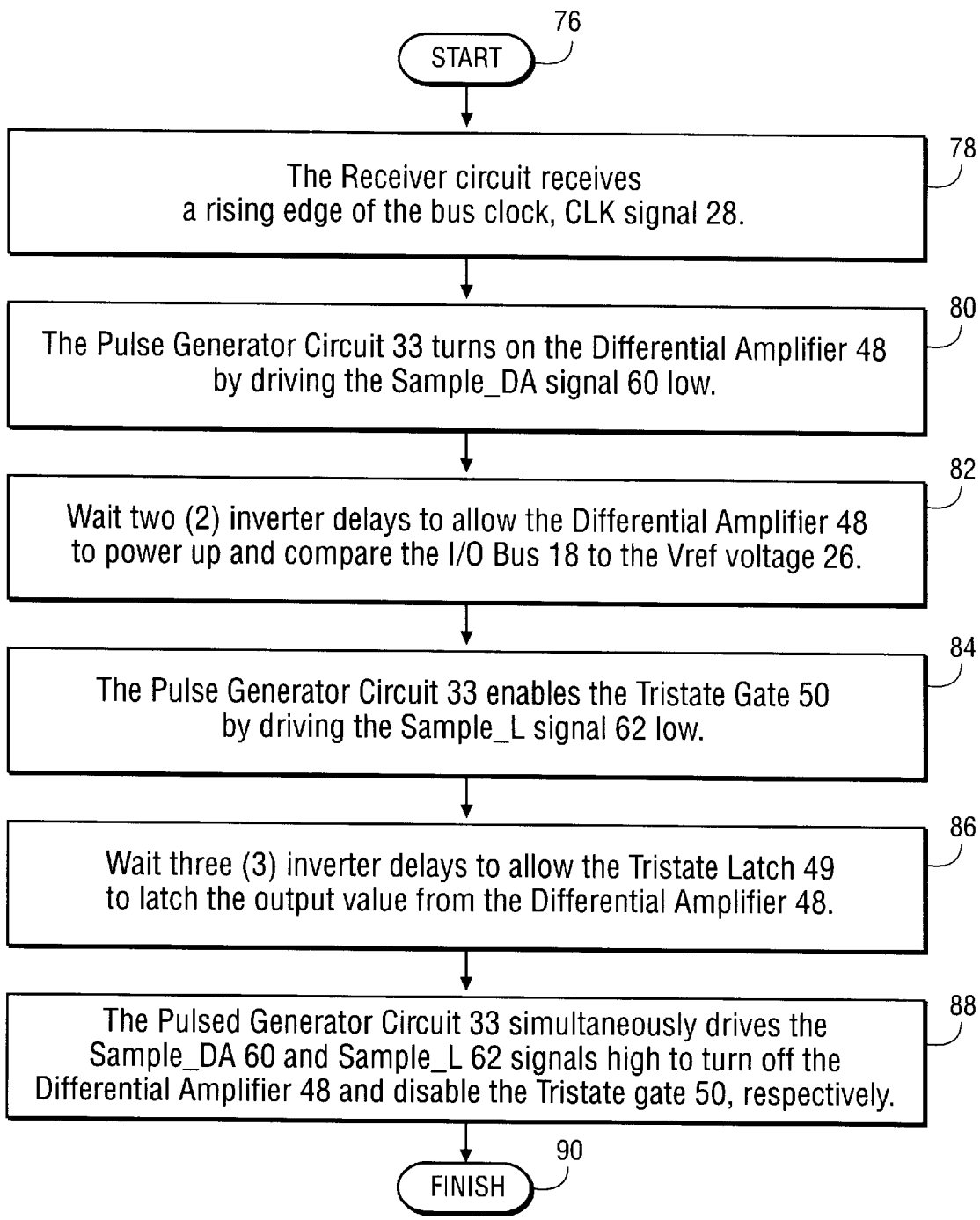
FIG. 4 is a flowchart illustrating an embodiment of the method of the present invention.

Referring now to FIG. 4, the method of an embodiment of the present invention is shown is illustrated in a flowchart. The method begins in step 76 where the differential amplifier 48 is in an off state. In step 78 the pulsed latch receiver 24 receives a rising edge of the bus clock, CLK signal 28. In step 80, in response to the rising edge of the CLK signal 28, the pulse generator 33 drives the Sample_DA signal 60 low to turn on the differential amplifier 48. In step 82, the method waits two (2) inverter delays to allow the differential amplifier 48 to power up and compare the value on the I/O Bus 18 to the Vref voltage 26. (It is apparent to one skilled in the art that an equivalent non-inverting delay can be implemented utilizing different numbers of inverters, R-C circuits, or other typical delay methods.) If the value of the I/O bus 18 is higher or lower than the Vref voltage 26, the amplifier output signal is pulled high or low, respectively. In step 84, the pulse generator 33 drives the Sample_L signal 62 low to enable the tristate gate 50 and drive the differential output value into the tristate latch 49. In step 86, the method waits three (3) inverter delays to allow the data to stabilize in the tristate latch 49. (It is apparent to one skilled in the art that an equivalent inverting delay can be implemented using different numbers of inverters, R-C circuits, or other common delay methods.) In step 88, the pulse generator 33 simultaneously drives the Sample_DA signal 60 and the Sample_L signal 62 high to turn off the differential amplifier and disable the tristate gate 50, respectively. In step 90, the method finishes.

In general, the present invention finds application in digital computer systems to reduce the power consumption and eliminate static DC current in components having I/O transceiver circuits.

Figure 5:
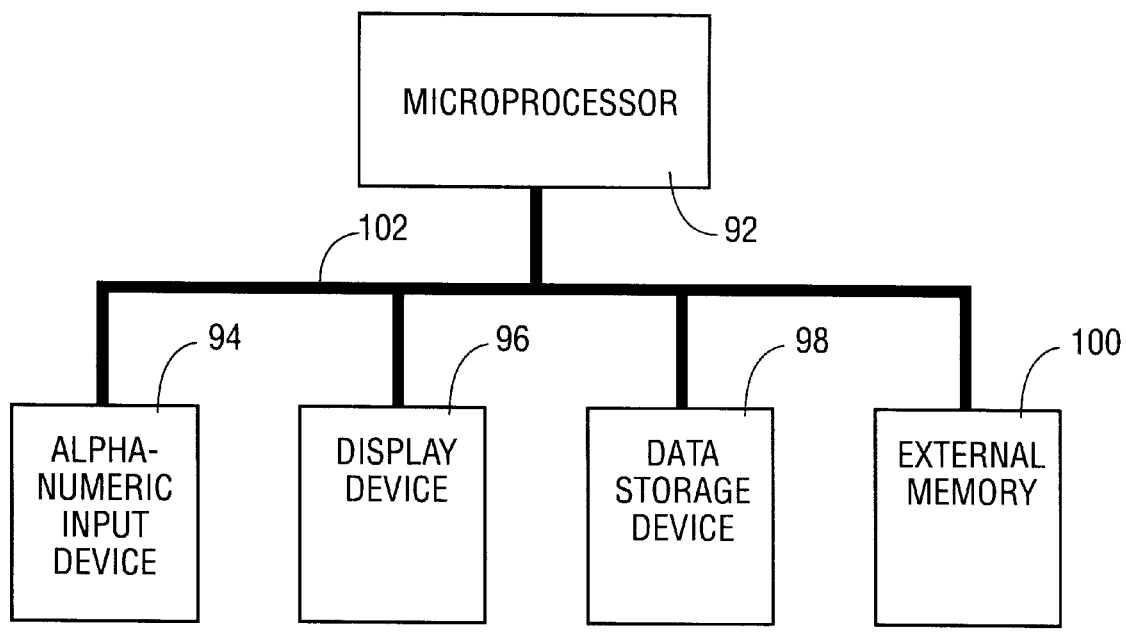
FIG. 5 is a block diagram of an illustrative computer system utilizing a microprocessor that incorporates the I/O transceiver circuits of the present invention.

Referring now to FIG. 5, an illustrative computer system incorporating the present invention is shown, including a microprocessor 92, an alphanumeric input device 94, a display device 96, a data storage device 98, and an external memory 100 all coupled to a system bus 102. The system bus comprises the address, data, and control lines necessary for transferring data between the various components of the system. The alphanumeric input device 94, such as a keyboard, allows a computer user to communicate information and commands to the microprocessor. The display device 96, such as a video display terminal, displays information to the computer user. The data storage device 98, such as a hard disk, stores information. The external memory 100, such as a RAM memory, stores temporary information. It should be understood that not all of these components are necessary for a given computer system implementation, that additional components may be present in a given computer system, and that alternate system designs, such as local high-speed busses, may be used.

In the computer system of FIG. 5, the pulsed latch receiver of the present invention is implemented in a plurality of I/O transceiver circuits 30 on the microprocessor 92 to reduce power consumption and eliminate DC static current. The bus clock, CLK signal 28, and the I/O bus 18 lines are part of the system bus 102. In the preferred embodiment, each of the I/O bus lines are terminated on each end with external resistors as shown in FIG. 1. To receive information from the system bus 102, each of the pulsed latch receiver circuits on the microprocessor 92 operate according to the sampling method of the present invention. In response to a rising edge of the CLK signal 28, each pulse generator generates a pulse on its Sample_DA signal to cause that pulsed latch receiver's differential amplifier to compare the voltage of its I/O bus input to the Vref reference voltage. Each pulse generator also generates a Sample_L pulse to cause that pulsed latch receiver's tristate latch to latch the result of the differential comparison. Subsequently, each pulse generator drives its Sample_DA and Sample_L signals high to turn off their respective differential amplifier (to prevent unnecessary power dissipation) and disable the tristate gates (to preserve the information in the tristate latches). Since the differential amplifiers are only turned on for a fraction of the period of the CLK signal 28, the power dissipation of the pulsed latch receivers of the microprocessor 92 is significantly reduced.

Use of the pulsed latch receivers in a microprocessor of a computer system provides the following advantages to a computer system. First, power dissipation of the microprocessor 92 is decreased because the differential amplifiers are turned on for only a fraction of the period of the bus clock. This savings in power dissipation can eliminate the need for thermal protection devices such as heat sinks, fans, etc. Second, the performance of the I/O receivers of the microprocessor system can be improved while maintaining reduced power dissipation. For example, in one embodiment the transistors of the differential amplifier have been increased in size to double the speed performance of the receiver while reducing power dissipation by 50% compared to the standard GTL receiver having half the speed performance. Third, battery drain due to static DC current in the receivers is reduced to zero. This is important in extending the battery life for mobile computing systems. Finally, defects in the microprocessor can be detected using IDDQ testing because static DC current in the receiver circuits is eliminated.

The invention has been described in conjunction with preferred embodiments. It is evident that numerous alternative, modifications, variations, and uses will be apparent to those skilled in the art in light of the foregoing description.

Thus, an I/O transceiver having a pulsed latch receiver circuit, a method for sampling I/O lines, and an implementation of the pulsed latch receiver circuit in the I/O transceivers of a microprocessor in a computer system have been described.

What is claimed is:

1. A method for reducing the power consumption of a pulsed latch receiver circuit, the method comprising the steps of:

generating a first pulse using logic circuitry in response to a rising edge of a bus clock signal;

turning on a differential amplifier in response to the beginning of the first pulse;

comparing an I/O line voltage to a reference voltage to generate an output signal from the differential amplifier; and turning off the differential amplifier in response to an end of the first pulse.

2. A method for reducing the power consumption of a pulsed latch receiver circuit, the method comprising the steps of:

generating a first pulse using logic circuitry in response to a rising edge of a bus clock signal;

turning on a differential amplifier in response to the beginning of the first pulse;

comparing an I/O line voltage to a reference voltage to generate an output signal from the differential amplifier;

turning off the differential amplifier in response to an end of the first pulse;

waiting a first predetermined number of inverter delays after generating the first pulse before generating a second pulse;

enabling a tristate gate in response to the beginning to the second pulse, the tristate gate for driving the value of the amplifier output signal into a latch when enabled; and disabling the tristate gate in response to the end of the second pulse, the disabling to preserve the value of the amplifier output signal in the latch.

3. The method of claim 2 wherein the second pulse occurs during the occurrence of the first pulse.

* * * * *